(12) United States Patent
Lee et al.

(10) Patent No.: US 12,150,273 B2
(45) Date of Patent: Nov. 19, 2024

(54) COOLING APPARATUS FOR POWER MODULE

(71) Applicants: Hyundai Motor Company, Seoul (KR); Kia Corporation, Seoul (KR); CHUNG ANG University industry Academic Cooperation Foundation, Seoul (KR)

(72) Inventors: Sang Hun Lee, Taebaek-si (KR); Se Heun Kwon, Incheon (KR); Seong Min Lee, Seoul (KR); Je Hwan Lee, Seongnam-si (KR); Hyong Joon Park, Hwaseong-si (KR); Yun Seo Kim, Seoul (KR); Geon Hee Lee, Seoul (KR); Dae Young Kong, Seoul (KR); Min Soo Kang, Seoul (KR); Hyoung Soon Lee, Seoul (KR)

(73) Assignees: HYUNDAI MOTOR COMPANY, Seoul (KR); KIA CORPORATION, Seoul (KR); CHUNG ANG UNIVERSITY INDUSTRY ACADEMIC COOPERATION FOUNDATION, Seoul (KR)

(*) Notice: Subject to any disclaimer, the term of this patent is extended or adjusted under 35 U.S.C. 154(b) by 200 days.

(21) Appl. No.: 17/980,889

(22) Filed: Nov. 4, 2022

(65) Prior Publication Data

US 2023/0200008 A1    Jun. 22, 2023

(30) Foreign Application Priority Data

Dec. 20, 2021 (KR) .......................... 10-2021-0183141

(51) Int. Cl.
*H05K 7/20* (2006.01)

(52) U.S. Cl.
CPC ..... *H05K 7/20272* (2013.01); *H05K 7/20927* (2013.01)

(58) Field of Classification Search
CPC .......... H05K 7/20254; H05K 7/20272; H05K 7/20281; H05K 7/2089; H05K 1/0209;
(Continued)

(56) References Cited

U.S. PATENT DOCUMENTS 6,536,516 B2    3/2003  Davies et al.
7,836,597 B2    11/2010 Datta et al.
(Continued)

FOREIGN PATENT DOCUMENTS

CN    205940237 U    2/2017
CN    110425914 A    11/2019
(Continued)

OTHER PUBLICATIONS

Extended European Search Report dated May 11, 2023, issued in corresponding European Patent Application No. 22208313.1.

*Primary Examiner* — Michael A Matey
(74) *Attorney, Agent, or Firm* — Morgan, Lewis & Bockius LLP

(57) ABSTRACT

A cooling apparatus for a power module including a plurality of cooling modules provided to be in contact with each of both surfaces of the power module, in which the cooling module includes a manifold cover provided with a plurality of guide walls extending in a first direction in a state of being spaced apart from each other and a pin plate having one surface being in contact with the power module and having a plurality of pins extending in a second direction crossing the first direction formed on the other surface thereof.

13 Claims, 8 Drawing Sheets

(58) Field of Classification Search
CPC ........... H05K 7/14329; H05K 7/20145; H05K 7/20218; H05K 7/20927; H01L 23/473; H01L 23/46; H01L 2924/13055; H01L 2924/13091; F28F 3/12; F28F 2215/04; H02K 11/33

See application file for complete search history.

(56) References Cited

U.S. PATENT DOCUMENTS

| | | | |
|---|---|---|---|
| 7,836,940 | B2 | 11/2010 | Campbell et al. |
| 8,755,185 | B2 * | 6/2014 | Chou ............... H01L 24/33 |
| | | | 165/80.4 |
| 9,247,679 | B2 | 1/2016 | Joshi et al. |
| 9,445,526 | B2 | 9/2016 | Zhou et al. |
| 11,350,545 | B2 * | 5/2022 | Yang ............... H01L 23/473 |
| 11,596,088 | B2 * | 2/2023 | Zhou ............... H05K 7/20927 |
| 11,849,569 | B2 * | 12/2023 | Zhou ............... H05K 7/20254 |
| 2007/0062673 | A1 * | 3/2007 | Olesen ............... F28F 9/0268 |
| | | | 257/E23.098 |
| 2014/0158324 | A1 * | 6/2014 | Tochiyama ......... H01L 23/473 |
| | | | 165/67 |
| 2014/0252585 | A1 | 9/2014 | Chen et al. |
| 2014/0327128 | A1 * | 11/2014 | Yoo ............... H01L 23/29 |
| | | | 257/713 |
| 2015/0348869 | A1 * | 12/2015 | Joshi ............... H01L 25/07 |
| | | | 165/104.31 |
| 2016/0265854 | A1 | 9/2016 | Rice |
| 2016/0309614 | A1 * | 10/2016 | Kikuchi ............ H05K 7/2089 |
| 2017/0055378 | A1 * | 2/2017 | Zhou ............... H05K 7/20927 |
| 2018/0077818 | A1 * | 3/2018 | Harkins ............ H05K 7/209 |
| 2018/0261526 | A1 * | 9/2018 | Machler ............ H01L 23/473 |
| 2019/0090388 | A1 * | 3/2019 | Jeong .............. F25B 31/008 |
| 2019/0181717 | A1 * | 6/2019 | Zhou ............... H02K 11/33 |
| 2020/0344920 | A1 * | 10/2020 | Lee ............... H01L 23/44 |
| 2020/0375069 | A1 * | 11/2020 | Zhang ............. H01L 23/4093 |
| 2021/0239310 | A1 * | 8/2021 | Zhou ............. H01L 23/467 |
| 2021/0243923 | A1 * | 8/2021 | Hwang ............ H05K 7/2029 |
| 2021/0280498 | A1 * | 9/2021 | Kang ............... H01L 23/3675 |
| 2021/0337703 | A1 * | 10/2021 | Lee ............... H01L 23/473 |

FOREIGN PATENT DOCUMENTS

| | | |
|---|---|---|
| KR | 10-2020-0092926 A | 8/2020 |
| KR | 10-2023-0090747 A | 6/2023 |

* cited by examiner

[FIG. 1]
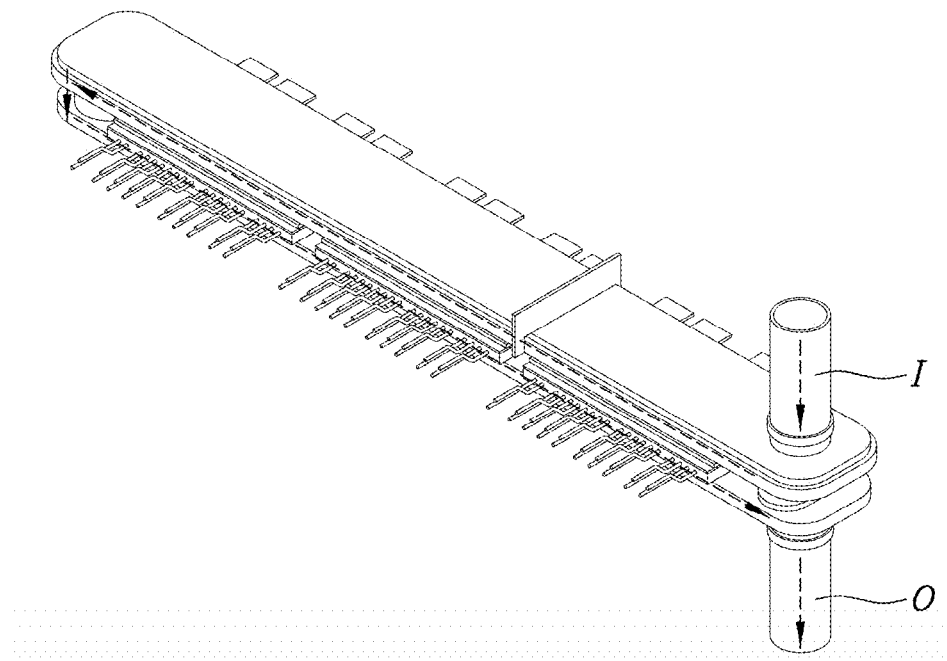

[FIG. 2]
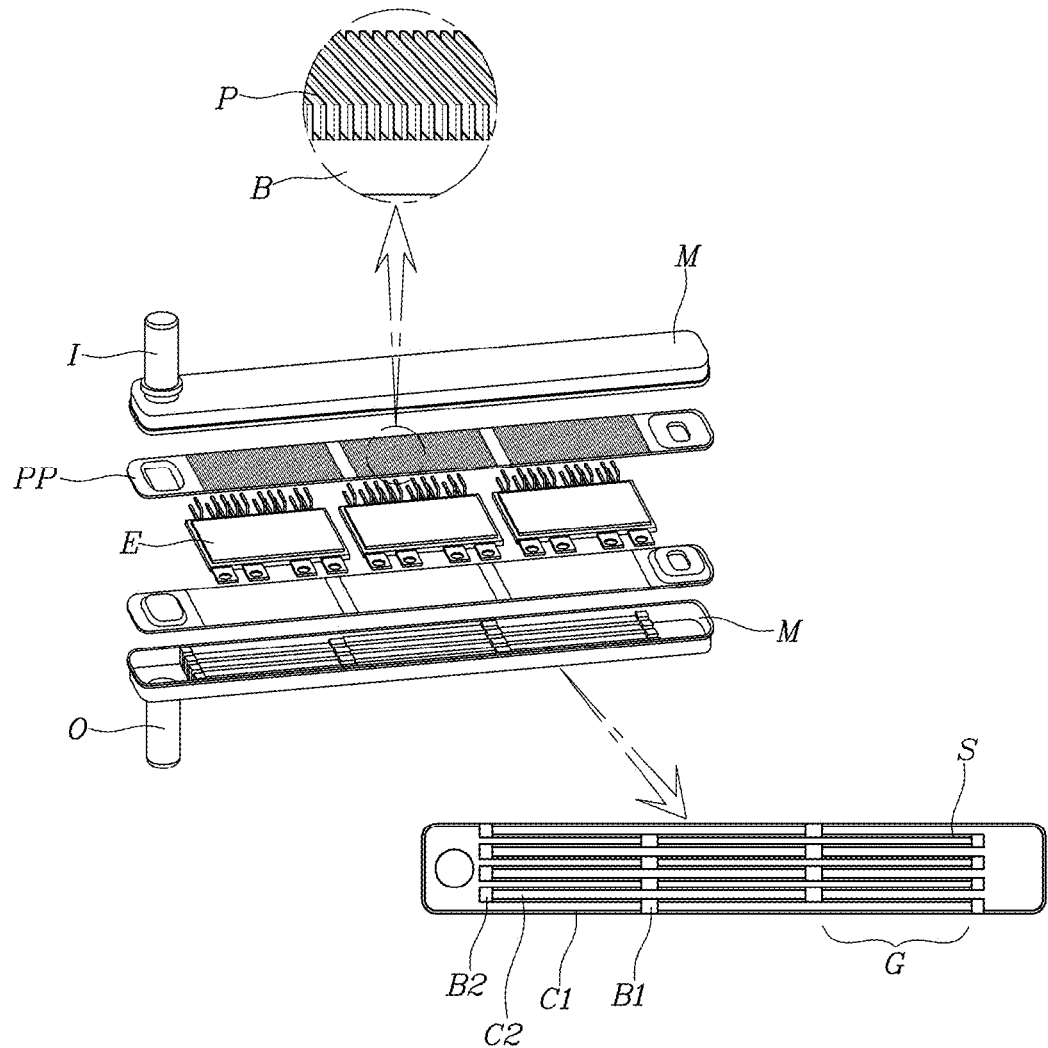

[FIG. 3]
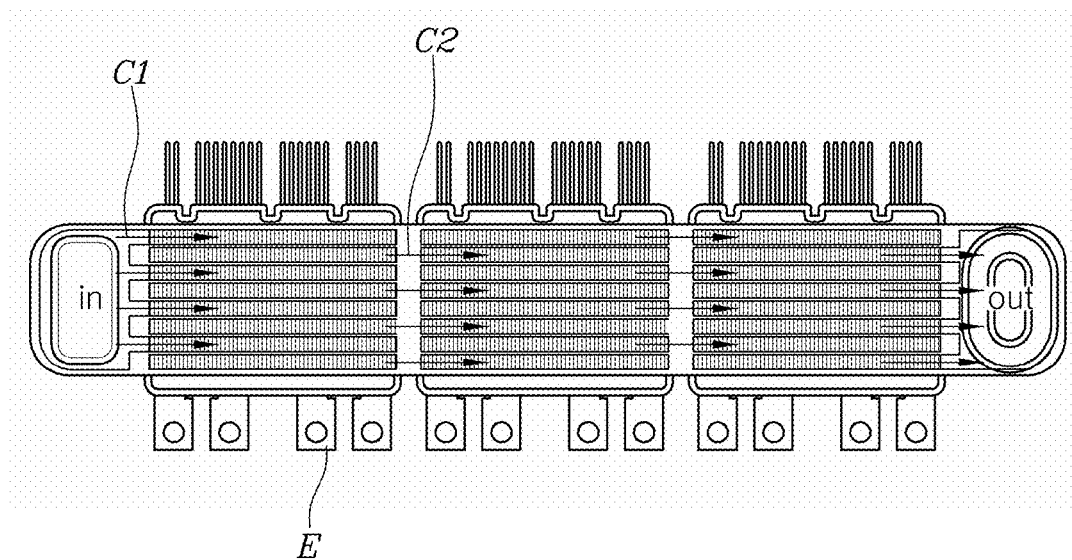

[FIG. 4]
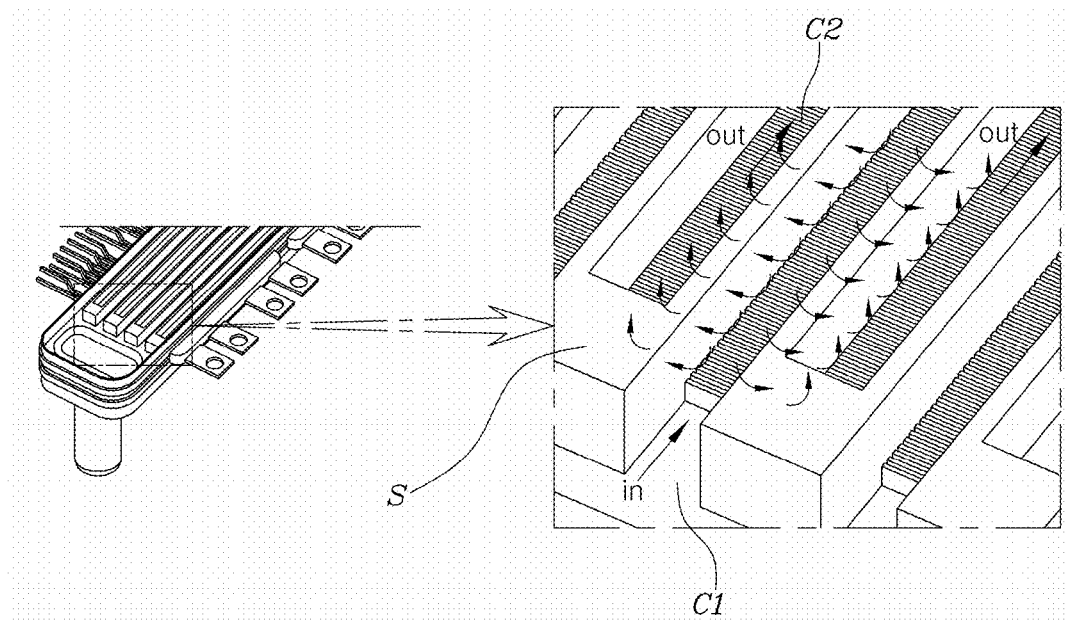

[FIG. 5]
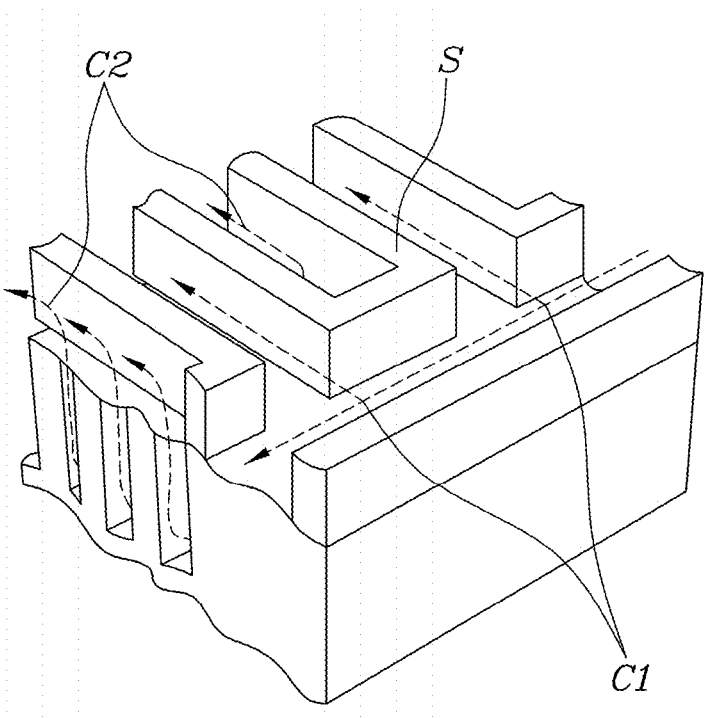

[FIG. 6]
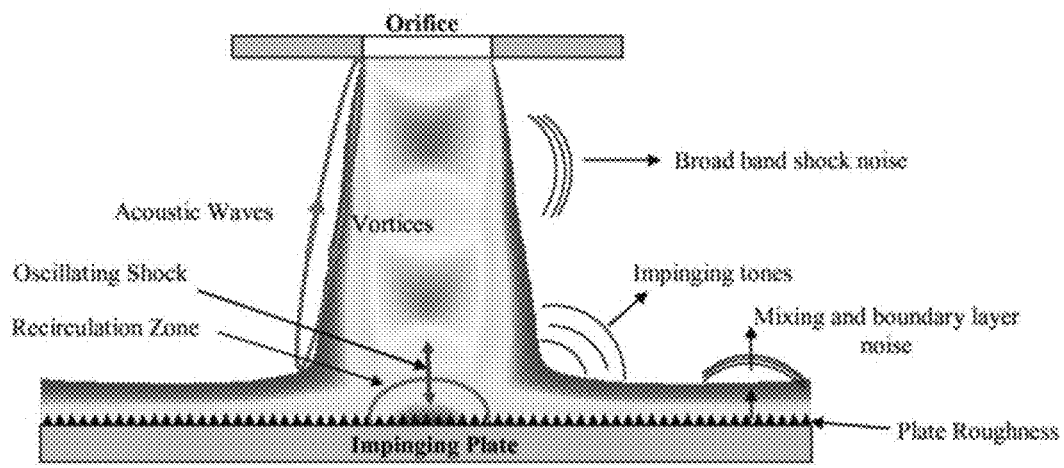

[FIG. 7]
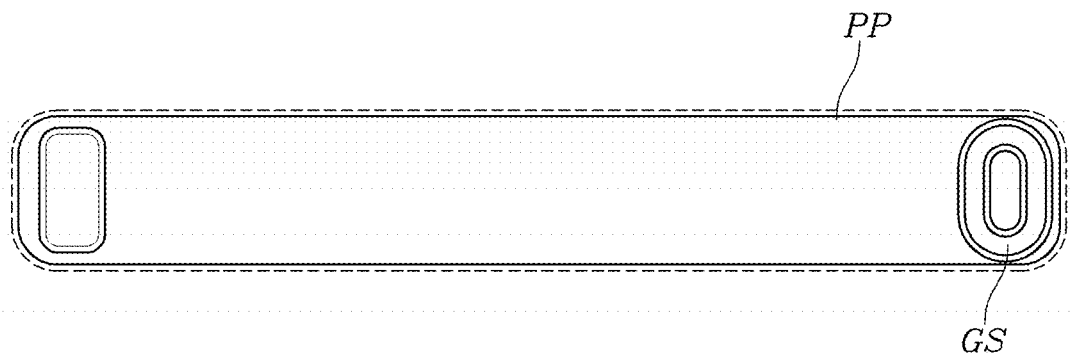

[FIG. 8]
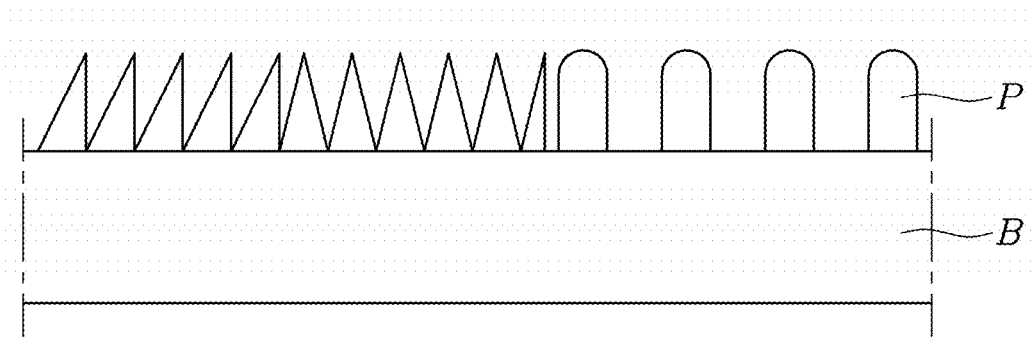

COOLING APPARATUS FOR POWER MODULE

CROSS REFERENCE TO RELATED APPLICATION

The present application claims priority of Korean Patent Application No. 10-2021-0183141 filed on Dec. 20, 2021, the entire contents of which is incorporated herein for all purposes by this reference.

TECHNICAL FIELD

The present disclosure relates to a cooling apparatus for a power module cooling the power module by using a cooling fluid.

BACKGROUND

A power module is applied to an electric vehicle, etc. to control a high voltage and a large current. Therefore, the amount of heat generated is very large and therefore, proper cooling is required to maintain performance and durability. To this end, the power module is cooled through a cooling fluid, or the waste heat of the power module is used to heat a vehicle.

In the conventional case, it is common to connect a cooling apparatus to one side surface of the power module in order to cool this power module and to distribute the cooling fluid to the cooling apparatus. However, there is a problem in that cooling efficiency is not high by applying a simple tube structure or pin structure generally used to the conventional cooling apparatus.

Since the cooling efficiency of the electric vehicle, etc. is closely related to the overall energy efficiency of the vehicle and greatly affects the durability or performance maintenance of the power module as well, it is necessary to increase the cooling efficiency of the power module through a new cooling structure.

The aforementioned background art is technical information possessed by the inventor to derive the exemplary embodiments of the present disclosure or acquired in the derivation process, and is only for enhancing the understanding of the background of the present disclosure. Therefore, the background art should not be taken as being admitted to corresponding to the known art published to the general public prior to the filing of the exemplary embodiments of the present disclosure or the related art already known to those skilled in the art.

SUMMARY OF THE DISCLOSURE

An object of the present disclosure is to provide a cooling apparatus for a power module, which vertically sprays a cooling fluid on a heat-generated surface through a micropin of a pin plate configured in a direction perpendicular to a direction of a manifold cover and cools the heat-generated surface to cause the vertical turbulent flow of the cooling fluid.

The present disclosure provides a cooling apparatus for a power module including a plurality of cooling modules to contact each of both surfaces of the power module, in which the plurality of cooling modules include a first cooling module and a second cooling module, and at least one of the first and second cooling modules includes: a manifold cover including: a plurality of guide walls extending in a first direction in a state of being spaced apart from each other, and a plurality of cooling channels through the plurality of guide walls, the plurality of cooling channels having a first channel and a second channel, a first end of the first channel is blocked and a second end of the second channel is blocked, the second end of the second channel is opposite the first end of the first channel; and a pin plate having one surface to contact the power module, the pin plate having a plurality of pins extending in a second direction crossing the first direction and disposed on the other surface of the pin plate, and the pin plate is coupled to the manifold cover so that at least one of the plurality of pins faces at least one of the plurality of guide walls, so that cooling fluid to be introduced into the first channel flows in the second direction and then flows out through the second channel.

The first channel may include a first blocking part connecting first ends of first guide walls on both sides of the first channel so that an outlet side of the first channel is blocked, and the second channel includes a second blocking part connecting second ends of second guide walls on both sides of the second channel so that an inlet side of the second channel is blocked, and the second ends of the second guide walls are opposite the first ends of the first guide walls.

A crossing angle between the first direction and the second direction may be 80 degrees to 100 degrees.

The first direction and the second direction may vertically cross each other.

The first cooling module may contact one surface of the power module and include an inlet through which the cooling fluid is to be introduced through a supply flow path and the second cooling module may contact the other surface of the power module and include an outlet through which the cooling fluid is to flow out through a discharge flow path.

The inlet may be disposed in the manifold cover of the first cooling module, and the outlet may be disposed in the manifold cover of the second cooling module.

The pin plate of the first cooling module may contact one side surface of the power module, the pin plate of the second cooling module may contact with the other side surface of the power module, and ends of the pin plates of the first cooling module and the second cooling module facing each other may be connected to each other through a connection part to distribute the cooling fluid.

The pin plates of the first cooling module and the second cooling module facing each other may be spaced apart from each other by a thickness of the power module, and the connection part may be disposed at a point between the spaced pin plates.

At least one pin among the plurality of pins of the pin plate may protrude from the pin plate, and the at least one pin may have a shape in which a horizontal cross-sectional area is reduced toward the protruding end.

The at least one pin may have a shape in which a vertical cross-sectional shape of the protruding end is a triangle or a curve.

The manifold cover may further include a rim welding, adhered, or bolted to the pin plate.

A plurality of power modules may be arranged to be spaced apart from each other and between the plurality of cooling modules, so that the plurality of power modules may share the plurality of cooling modules, and the plurality of cooling modules may include a plurality of channel groups to correspond to each of the power module.

The first channel and the second channel may be present in each of the plurality of channel groups, the first channel may include a first blocking part connecting first ends of first guide walls on both sides of the first channel to block an outlet side thereof, and the second channel may include a second blocking part connecting second ends of second guide walls on both sides of the second channel to block an inlet side thereof, and the second ends of the second guide walls are opposite the first ends of the first guide wall.

The first channel of an one side channel group may have the first blocking part connected to the second blocking part of the second channel of the other side channel group adjacent thereto, and the second channel of the one side channel group may have the outlet side connected to an inlet side of the first channel of the other side channel group adjacent thereto.

According to the cooling apparatus for the power module according to the present disclosure, it is possible to vertically spray the cooling fluid on the heat-generated surface through the micropin of the pin plate configured in the direction perpendicular to the direction of the manifold cover and to cool the heat-generated surface to cause the vertical turbulent flow of the cooling fluid, thereby increasing the heat-dissipation performance of the cooling apparatus even without the separate nozzle spray apparatus.

The effect of the present disclosure is not limited to the aforementioned technical effects, and other technical effects may also be derived from the following description.

BRIEF DESCRIPTION OF THE DRAWINGS

The above and other objects, features and other advantages of the present disclosure will be larger clearly understood from the following detailed description when taken in conjunction with the accompanying drawings, in which:

FIG. 1 is a perspective diagram of a cooling apparatus for a power module according to an exemplary embodiment of the present disclosure.

FIG. 2 is an exploded perspective diagram of the cooling apparatus for the power module shown in FIG. 1.

FIG. 3 is a diagram showing a channel of the cooling apparatus for the power module shown in FIG. 1.

FIG. 4 is a diagram showing a mechanism of the cooling apparatus for the power module shown in FIG. 1.

FIG. 5 is a diagram showing a microchannel of the cooling apparatus for the power module shown in FIG. 1.

FIG. 6 is a diagram showing a thermal analysis simulation result of the cooling apparatus for the power module shown in FIG. 1.

FIG. 7 is a diagram showing a gasket formed on a pin plate of the cooling apparatus for the power module shown in FIG. 1.

FIG. 8 is a diagram showing a pin of a cooling apparatus for a power module according to various exemplary embodiments of the present disclosure.

DETAILED DESCRIPTION OF THE DISCLOSURE

Specific structural or functional descriptions of the exemplary embodiments of the present disclosure disclosed in the present specification or application are only exemplified for the purpose of describing the exemplary embodiments according to the present disclosure, and the exemplary embodiments according to the present disclosure may be embodied in various forms and should not be interpreted as being limited to the exemplary embodiments described in the present specification or application. Hereinafter, exemplary embodiments of the present disclosure will be described in detail with reference to the accompanying drawings.

FIG. 1 is a perspective diagram of a cooling apparatus for a power module according to an exemplary embodiment of the present disclosure, and FIG. 2 is an exploded perspective diagram of the cooling apparatus for the power module shown in FIG. 1. Therefore, a cooling apparatus for a power module according to an exemplary embodiment of the present disclosure includes a power module E and a plurality of cooling modules provided to be in contact with each of both surfaces of the power module in order to cool the power module. Each cooling module is provided with a manifold cover M provided with a plurality of guide walls S extending in a first direction to partition a cooling channel into a plurality of cooling channels so that a cooling fluid flows from an inlet to an outlet in the first direction. In addition, the plurality of cooling channels partitioned by the guide wall S are composed of a first channel C1 whose outlet side is blocked and a second channel C2 whose inlet side is blocked.

In addition, the cooling module according to the present disclosure is provided with a pin plate PP. The pin plate PP has one surface being in contact with the power module E and has a plurality of pins (P) extending in a second direction formed on the other surface thereof so that the cooling fluid introduced from the inlet to the first channel C1 flows in the second direction crossing the first direction and then flows to the outlet through the second channel C2. In other words, the cooling fluid is designed to be partitioned into a plurality of cooling fluids, guided in the first direction, and then blocked to flow in the second direction in which the pin P extends to form an impingement jet cooling structure, thereby increasing the efficiency of heat exchange.

First, as shown in FIG. 1, the cooling apparatus for the power module according to an exemplary embodiment of the present disclosure is designed based on double-sided cooling that simultaneously cools all of both surfaces of the power module E. Therefore, as shown in FIGS. 1 and 2, the cooling apparatus for the power module may be configured in a series-type structure in which the cooling fluid introduced from an inlet I flows and flows out to an outlet O. Although FIG. 1 shows a direction in which the cooling fluid flows from the top to the bottom, the flow direction may also be opposite thereto and is not limited to only the vertical direction.

As shown in FIG. 2, the pin plate PP has one surface of a plate B being in contact with the power module E and has the plurality of pins P formed on the other surface thereof. The manifold cover M includes the first channel C1 whose outlet side is blocked and the second channel C2 whose inlet side is blocked. The power module E is cooled by forming the cooling module including the manifold cover M and the pin plate PP to be in contact with each of both surfaces of the power module E.

In the cooling apparatus for the power module according to the exemplary embodiment of the present disclosure, the first channel C1 may include a first blocking part B1 formed to protrude from the end from which the guide wall extends in order to block the outlet side thereof in the manifold cover M, and the second channel C2 may include a second blocking part B2 formed to protrude from the end from which the guide wall extends in order to block the inlet side thereof in the manifold cover M.

In other words, the first blocking part B1 and the second blocking part B2 may be configured so that the cooling fluid introduced from the inlet flows and the outlet side of the first channel C1 is blocked, or the inlet side of the second channel C2 is blocked and the cooling fluid flows to the outlet side of the second channel C2, respectively. FIG. 2 shows each of the first blocking part B1 and the second blocking part B2 in a protruding form, but the present disclosure is not limited thereto. In addition, as shown in FIG. 2, the cooling apparatus for the power module according to the exemplary embodiment of the present disclosure is provided to be in contact with each of both surfaces of the power module E, thereby increasing cooling performance.

Specifically, the pin plate PP shown in FIG. 2 includes the pins P alternately formed at a separated interval to extend in the second direction. In other words, the pin P shown in FIG. 1 has the form of a fin pin configured like a fin. FIG. 2 shows that the pin P is formed in a direction perpendicular to the plate B, but the present disclosure is not limited thereto.

Meanwhile, as shown in FIG. 3, a cooling apparatus for a power module according to another exemplary embodiment of the present disclosure includes: a plurality of power modules E and a plurality of cooling modules provided to be in contact with each of both surfaces of the power module E in order to cool each power module E, in which the cooling module and the other cooling modules adjacent thereto are connected in series with each other.

Therefore, the cooling fluid flowing to the outlet through the second channel C2 flows into the first channels C1 of the manifold covers M of the other neighboring cooling modules connected in series. In other words, the cooling module cools the other neighboring power modules. In addition, the cooling apparatus for the power module according to another exemplary embodiment of the present disclosure allows the cooling fluid to cool the power module at a greater mass flow rate than in the method for cooling each power module in parallel.

Specifically, the plurality of power modules E are arranged to be spaced apart from each other between a pair of cooling modules, so that the plurality of power modules E may share the cooling module, and the cooling module may be formed with a plurality of channel group G to correspond to each power module E.

Each channel group G is provided with the first channel C1 and the second channel C2, in which the first channel (C1) is formed with the first blocking part B1 connecting one ends of the guide walls of both sides partitioning the first channel C1 in order to block the outlet side thereof, and the second channel C2 is formed with the second blocking part B2 connecting the other ends of the guide walls of both sides partitioning the second channel C2 to block the inlet side thereof.

The first blocking part of the first channel of an one side channel group is connected to the second blocking part of the second channel of the other side channel group adjacent thereto, and the second blocking part of the one side channel group has the outlet side connected to the inlet side of the first channel of the other side channel group adjacent thereto, so that the cooling fluid repeatedly moves in the order of the first channel—the second channel—the first channel and implements the impingement jet cooling.

In addition, as shown in FIG. 3, the second direction in which the pin P extends may be perpendicular to the direction in which the guide wall S extends. In other words, the first channel included in the manifold cover M allows the cooling fluid to go through the vertical pin while flowing in the direction in which the guide wall S extends so that the effect of the impingement jet cooling may be implemented.

FIG. 4 is a diagram showing a mechanism of the cooling apparatus for the power module according to the exemplary embodiment of the present disclosure. As shown in FIG. 4, the guide wall S guides the cooling fluid to the inlet and the outlet to flow in the first direction. Since the cooling fluid flows in the first direction while overflowing the pin P having one surface being in contact with the power module E in the process of flowing in the first direction, the primary jet cooling is performed in this process. Next, the first channel C1 through which the cooling fluid flows in the first direction is configured to block the outlet side thereof. The blocked and overflowing cooling fluid overflows the plurality of pins P extending in the second direction crossing the first direction and flows into the second channel C2 through the top or bottom of the guide wall S. Therefore, in the cooling apparatus for the power module according to the exemplary embodiment of the present disclosure, turbulence, which is a velocity component in a direction perpendicular to the flow direction, occurs in the process in which the cooling fluid flows into the second channel C2. Thereafter, the second channel C2 is configured to block the inlet side, so that the cooling fluid flowing into the second channel C2 flows only to the outlet side.

The exemplary embodiment of the present disclosure provides an apparatus that uses the cooling fluid in order to cool the power module. In order to cool this power module, the exemplary embodiment of the present disclosure intends to apply the effect of the impingement jet cooling. Here, the impingement jet cooling means a cooling method capable of locally obtaining the high heat transfer effect as the method for directly spraying cooling air on a high-temperature wall to remove the heat. In order to actively implement the effect of the jet cooling method, it is necessary to use turbulent flow other than laminar flow. Here, the turbulence means a flow having a velocity component in the direction perpendicular to the flow direction, that is, a flow having irregularity and diffusivity due to vertical and horizontal 3D vorticity other than the flow direction. When the turbulence occurs around the object, the cooling area and the mixing of the cooling fluid may become larger, thereby increasing the cooling efficiency.

The cooling apparatus for the power module according to the exemplary embodiment of the present disclosure crosses the second direction in which the pin P of the pin plate extends with the first direction in which the cooling fluid flows to the guide wall of the manifold cover M in order to cause the turbulent flow to further increase the effect of this impingement jet cooling. This causes the turbulence beyond simply passing the pin plate as the laminar flow like the pock on a golf ball or the bumpy skin of a shark. Therefore, it is possible to improve the cooling performance of the cooling apparatus of the power module according to the exemplary embodiment of the present disclosure.

FIG. 5 is a diagram showing a microchannel of the cooling apparatus for the power module according to the exemplary embodiment of the present disclosure. As shown in FIG. 5, the cooling fluid is introduced from the inlet to form an inlet plenum that is the sum of narrow streams of water. The manifold cover M allows the cooling fluid guided based on the guide wall S to flow into the first channel C1 or the second channel C2 to be discharged through the plurality of pins P to forma microchannel. As the first direction in which the pin P extends and the second direction of the guide wall S of the manifold cover M cross each other, the turbulence occurs in the process in which the cooling fluid flowing into the first channel C1 is blocked at the outlet side and flows into the second channel C2 through the pin because the outlet side of the first channel C1 is blocked. The cooling fluid that is the turbulence passes through the pin P while flowing to the outlet side of the second channel C2, which is each manifold channel, because the inlet side thereof is blocked. Therefore, the cooling fluid of the second channel C2 with increased vorticity, irregularity, and diffusivity forms the effect of the higher impingement jet cooling.

Unlike shown in FIG. 5, in the cooling apparatus for the power module according to the exemplary embodiment of the present disclosure, a crossing angle at which the second direction and the first direction in which the pin P extends cross each other may be 80 degrees to 100 degrees. In other words, an angle between the direction in which the pin extends and the flow direction of the cooling fluid of the manifold cover is not necessarily 90 degrees, and another exemplary embodiment such as slightly tilting the direction of the pin may also be implemented.

FIG. 6 is a diagram showing a thermal analysis simulation result of the cooling apparatus for the power module according to the exemplary embodiment of the present disclosure. The cooling fluid flowing from the first channel C1 to the second channel C2 forms vortices around a recirculation zone to cause various shock waves such as oscillating shock, mixing and boundary layer noise, and broad band shock noise. Therefore, even a cooling fluid layer, which could not be cooled in the conventional impingement jet cooling of the laminar flow, is recirculated and involved in the cooling, thereby improving the cooling efficiency.

FIG. 7 is a diagram showing a gasket to which the manifold cover and the pin plate of the cooling apparatus for the power module according to the exemplary embodiment of the present disclosure are coupled, and FIG. 8 is a diagram showing the pin of the cooling apparatus for the power module according to the exemplary embodiment of the present disclosure.

Specifically, FIG. 7 is a diagram showing a gasket GS coupled to the pin plate PP of the cooling apparatus for the power module according to the exemplary embodiment of the present disclosure, and the pin plate PP may include a first pin plate coupled to a first surface of the power module E and a second pin plate coupled to a second surface opposite to the first surface of the power module E.

The pin plate of a first cooling module is in contact with one side surface of the power module, the pin plate of a second cooling module is in contact with the other side surface of the power module, and the ends of the pin plates of the first and second cooling modules facing each other may be connected to each other through a connection part GS to distribute the cooling fluid. In addition, the facing pin plates of the first cooling module and the second cooling module may be spaced apart from each other by the thickness of the power module, and the connection part GS may be provided at a point between the separated pin plates.

In other words, the pin plate PP is designed to be in close contact with the power module E to cool both surfaces of the upper and lower surfaces of the power module E. Therefore, as shown in FIG. 7, the pin plate PP may include the gasket GS having a concave or protruding shape as the connection part GS.

In addition, as a region shown by the dotted line in FIG. 7, the manifold cover M of the cooling apparatus for the power module according to the exemplary embodiment of the present disclosure may be coupled to the pin plate PP in any one method among weld joint, adhesive bonding, and bolted joint.

FIG. 8 is a diagram showing the pin of the cooling apparatus for the power module according to the exemplary embodiment of the present disclosure, and in the cooling apparatus for the power module according to the exemplary embodiment of the present disclosure, a partial or entire shape of the portion where the pin P is formed may be formed so that the size of a first cross section of the pin perpendicular to the direction in which the pin P extends is reduced in the protruding direction. In addition, in the cooling apparatus for the power module according to the exemplary embodiment of the present disclosure, for the shape of a portion or the entire portion where the pin P is formed, a shape of a second cross section of the pin parallel to the direction in which the pin extends may be formed in any one of a right-angled triangle, an isosceles triangle, and a semicircle.

As in the exemplary embodiment shown in FIG. 8, the pins P may also be alternately formed to be spaced apart from each other at a predetermined interval, and may be repeatedly formed without the predetermined interval. As in another exemplary embodiment shown in FIG. 8, the pin P may have a reduced cross-sectional area of the partial region or the entire region in the direction in which the pin extends, and the pin may be a right-angled triangular, isosceles triangular, or semicircular protrusion structure. Of course, as shown in FIG. 4, the pin may be a rectangular protrusion structure, but is not limited thereto.

The cooling apparatus for the power module according to the exemplary embodiment of the present disclosure uses the impingement jet cooling. The impingement jet cooling may locally obtain the high heat transfer effect by the method for spraying refrigerant on the local heat-generated surface at high speed to remove the heat. Therefore, it is possible to increase the operation lifespan of the power module. In addition, the cooling apparatus for the power module according to the exemplary embodiment of the present disclosure effectively implements the impingement jet cooling only by coupling the pin plate to the manifold cover without having to complexly design the channel (flow path) through which the sprayed refrigerant passes in one direction. Therefore, according to the cooling apparatus for the power module according to the exemplary embodiment of the present disclosure, it is possible to simplify the manufacturing process, and to reduce the number of components, thereby reducing the manufacturing cost.

While the specific exemplary embodiments of the disclosure have been shown and described, it will be apparent to those skilled in the art that the present disclosure may be variously improved and changed without departing from the technical spirit of the present disclosure provided by the appended claims.

What is claimed is:

1. A cooling apparatus for a power module comprising a plurality of cooling modules including a first cooling module and a second cooling module provided to be in contact with each of both surfaces of the power module,
    wherein each of the cooling module comprises
        a manifold cover provided with a plurality of guide walls extending in a first direction in a state of being spaced apart from each other, formed with a plurality of cooling channels through the guide wall, and having one end of a first channel of the cooling channels blocked and the other end of a second channel opposite the one end blocked;
        a pin plate having one surface being in contact with the power module, having a plurality of pins extending in a second direction crossing the first direction formed on the other surface thereof, and being coupled to the manifold cover so that the pin faces the guide wall, so that a cooling fluid flowing into the first channel flows in the second direction and then flows out through the second channel, and
    wherein the pin plate of the first cooling module is in contact with one side surface of the power module, the pin plate of the second cooling module is in contact with the other side surface of the power module, and the ends of the pin plates of the first cooling module and the second cooling module facing each other are connected to each other through a connection part to distribute the cooling fluid.

2. The cooling apparatus for the power module of claim 1, wherein the first channel includes a first blocking part connecting first ends of first guide walls on both sides of the first channel to block an outlet side thereof, and the second channel includes a second blocking part connecting second ends of second guide walls on both sides of the second channel to block an inlet side thereof, and the second ends of the second guide walls are opposite the first ends of the first guide walls.

3. The cooling apparatus for the power module of claim 1, wherein a crossing angle between the first direction and the second direction is 80 degrees to 100 degrees.

4. The cooling apparatus for the power module of claim 1, wherein the first direction and the second direction vertically cross each other.

5. The cooling apparatus for the power module of claim 1, wherein
the first cooling module is to contact one surface of the power module and comprises an inlet through which the cooling fluid is to be introduced through a supply flow path and
the second cooling module is to contact the other surface of the power module and comprises an outlet through which the cooling fluid is to flow out through a discharge flow path.

6. The cooling apparatus for the power module of claim 5, wherein the inlet is disposed in the manifold cover of the first cooling module, and the outlet is disposed in the manifold cover of the second cooling module.

7. The cooling apparatus for the power module of claim 1, wherein the pin plates of the first cooling module and the second cooling module facing each other are spaced apart from each other by a thickness of the power module, and the connection part is disposed at a point between the spaced pin plates.

8. The cooling apparatus for the power module of claim 1, wherein at least one pin among the plurality of pins of the pin plate protrudes from the pin plate, and the at least one pin has a shape in which a horizontal cross-sectional area is reduced toward the protruding end.

9. The cooling apparatus for the power module of claim 8, wherein the at least one pin has a shape in which a vertical cross-sectional shape of the protruding end is a triangle or a curve.

10. The cooling apparatus for the power module of claim 1, wherein the manifold cover further includes a rim welded, adhered, or bolted to the pin plate.

11. The cooling apparatus for the power module of claim 1, wherein a plurality of power modules are to be arranged to be spaced apart from each other and between the plurality of cooling modules, so that the plurality of power modules share the plurality of cooling modules, and the plurality of cooling modules further includes a plurality of channel groups to correspond to each of the power module.

12. The cooling apparatus for the power module of claim 11, wherein the first channel and the second channel are present in each of the plurality of channel groups, the first channel includes a first blocking part connecting first ends of first guide walls on both sides of the first channel to block an outlet side thereof, and the second channel includes a second blocking part connecting second ends of second guide walls on both sides of the second channel to block an inlet side thereof, and the second ends of the second guide walls are opposite the first ends of the first guide walls.

13. The cooling apparatus for the power module of claim 12, wherein the first channel of one side channel group has the first blocking part connected to the second blocking part of the second channel of the other side channel group adjacent thereto, and the second channel of the one side channel group has the outlet side connected to an inlet side of the first channel of the other side channel group adjacent thereto.

* * * * *